United States Patent [19]
El Hajji

[11] Patent Number: 6,046,951
[45] Date of Patent: Apr. 4, 2000

[54] PROCESS FOR CONTROLLING THE READ CIRCUIT OF A MEMORY PLANE AND CORRESPONDING MEMORY DEVICE

[75] Inventor: Noureddine El Hajji, Grenoble, France

[73] Assignee: STMicroelectronics S.A., Gentilly, France

[21] Appl. No.: 09/231,761

[22] Filed: Jan. 15, 1999

[30] Foreign Application Priority Data

Jan. 23, 1998 [FR] France ................................ 98 00726

[51] Int. Cl.$^7$ ............................................. G11C 7/02
[52] U.S. Cl. ........................... 365/210; 365/203; 365/233
[58] Field of Search ................................ 365/210, 203, 365/233, 189.07, 189.09

[56] References Cited

U.S. PATENT DOCUMENTS

| 5,132,931 | 7/1992 | Koker | 365/210 |
|---|---|---|---|
| 5,245,584 | 9/1993 | Zampaglione et al. | 365/233 |
| 5,519,661 | 5/1996 | Miura | 365/205 |
| 5,596,539 | 1/1997 | Passow et al. | 365/210 |
| 5,627,781 | 5/1997 | Hayashi et al. | 365/205 |
| 5,694,369 | 12/1997 | Abe | 365/210 |
| 5,912,856 | 6/1999 | Lee et al. | 365/226 |
| 5,936,904 | 8/1999 | El Hajji | 365/205 |

*Primary Examiner*—David Nelms
*Assistant Examiner*—Hien Nguyen
*Attorney, Agent, or Firm*—Theodore E. Galanthay; Allen, Dyer, Doppelt, Milbrath & Gilchrist, P.A.

[57] ABSTRACT

The reading of a reference memory slot placed outside the memory plane is detected by comparing the voltage difference at the terminals of one of the two bit lines of the additional column with VDD/2. Only the read amplifiers of the memory are then activated.

27 Claims, 5 Drawing Sheets

PROCESS FOR CONTROLLING THE READ CIRCUIT OF A MEMORY PLANE AND CORRESPONDING MEMORY DEVICE

FIELD OF THE INVENTION

The invention relates to memory devices, and more particularly the control of their associated read circuit. The invention applies to any type of memory, such as the static or dynamic random-access (RAM) type or of the read-only (ROM) type.

BACKGROUND OF THE INVENTION

Conventionally, memory devices of the type comprising a memory plane, that is, a matrix of memory cells (memory slot) organized in rows and columns, comprises line selection means (line decoder) for selecting a line or row of memory cells on the basis of a selection signal propagating over a word line linked up to all the memory cells of the row. Column selection means are also provided. These usually comprise control transistors controlled by a column decoder so as to select one or more columns of memory cells, depending on the length of the memory word.

A write and precharge circuit, as well as a read circuit are connected to the column decoder. Finally, a control circuit makes it possible to control these various elements. The read circuit conventionally comprises one or more amplifiers (depending on the length of the memory word) which are intended to measure the voltage difference between the two column metallizations (bit lines) to which the memory cells of a single column are connected.

The person skilled in the art is aware that, during a read phase, after the two column metallizations have been precharged to a predetermined voltage, for example VDD, a line of cells is selected by activating the corresponding word line. The control transistors situated at the bottom of columns are turned on simultaneously and the desired column or columns are selected by driving the column decoder. Upon activation of the corresponding word line, one of the metallizations of the selected column remains at the precharge voltage, while the voltage of the other metallization drops. Of the two metallizations, the one whose voltage drops depends on the 0 or 1 value of the bit stored in the relevant memory cell. The voltage difference at the terminals of the two metallizations increases as one of the storage transistors of the memory cell discharges the stray capacitance of the metallization.

The person skilled in the art is aware that the reading of this voltage difference can only be performed when the latter is greater than the offset voltage of the amplifier of the read circuit. This can occur only at the expiration of a certain delay Tr after the activation of the corresponding word line. Now, it is at present very difficult to determine in advance the delay Tr, as well as the value of the offset of the amplifier which depends on the particular technology, on the temperature of operation, and on the manufacturing procedures used.

One approach performs statistical simulations which require advanced statistical data and tools. Moreover, this simulation turns out to be ineffective upon a change of technology, or of format, or of any other characteristic of the memory.

The same holds for the characterization of the delay Tr which is performed at present by simulation. This is unwieldy to implement since it requires a model of the complete memory. Also, any subsequent modification of the structure of the memory may impair the results of the simulation. Finally, the delay Tr is generated by using delay lines, and these too have to be characterized.

Architectural approaches have currently finally been achieved, which are designed to operate in the most unfavorable cases. This is so notably with regards to the value of the delay Tr separating the instant of activation of the word line selection signal from the signal for activating the read amplifier.

SUMMARY OF THE INVENTION

An object of the invention is to afford a more satisfactory approach to addressing the above mentioned problems.

Another object of the invention is to propose a general approach for making possible control of the critical phases of the read cycle of any type of memory.

Yet another object of the invention is to guarantee the proper operation of the memory while reducing the design time.

Yet another object of the invention is to propose an approach which can be used very easily in memory compilers (generators).

In general, the invention includes a memory device with autocalibrated control making it possible, irrespective of the type of memory, to guarantee reading of the memory cells when the voltage difference is greater than the offset of the amplifiers. The delay time is reduced to a large extent, and is determined automatically.

In this regard, the invention proposes to append, to the existing memory devices, additional circuitry having a negligible impact on the area, which does not modify the functional or structural characteristics of the memory plane. This circuitry makes it possible automatically to determine the appropriate instant for activating the read amplifier, taking account of its offset.

The invention therefore proposes a process for driving the read circuit of a memory plane. According to a general characteristic of the invention, with each selection of at least one memory cell of a line or row of the memory plane, this selection comprises the generation of a selection signal with regard to the corresponding word line of this row. An additional selection signal is also generated and is propagated over an additional word line of an additional line or row of line memory cells. This additional row is arranged in the exterior vicinity of the memory plane and configured in such a way as to exhibit conditions of propagation of the additional selection signal which are analogous to those of each row of the memory plane.

This additional selection signal is used to select a first reference memory cell, structurally analogous to the memory cells of the memory plane and of predetermined contents. The first reference memory cell is placed at the intersection of the additional row and of a first additional column of column memory cells which is likewise arranged in the exterior vicinity of the memory plane. This first additional column is configured in such a way as to exhibit a column capacitance whose value with respect to the capacitance of a column of the memory plane is predetermined.

The reading of the contents of the first reference cell is detected in a zone of the first additional column which is spaced substantially by the height of a column of the memory plane from the site of generation of the additional selection signal. The read circuit is then activated only if the detection occurs so as to allow the reading of the contents of the selected memory cell or cells of the memory plane.

Stated otherwise, each time one or more memory cells of a line or row of the memory plane is selected, a first reference memory cell is selected simultaneously. The first reference memory cell is structurally analogous to the memory cells of the memory plane, but of predetermined contents and obtained, for example, via a specific internal connection of the reference memory cell. This first reference memory cell is arranged outside the memory plane in a zone such that the duration separating the instant of generation of the additional selection signal and the instant of detection of the reading of the contents of this reference memory cell is at least equal to the durations of horizontal and vertical propagation of the corresponding signals. This makes it possible to read the contents of that memory cell of the memory plane which is furthest from the line decoder and from the column decoder.

Thus, the first reference memory cell is advantageously placed at the end of the additional row and at the far end from the additional means of line selection (additional line decoder) for activating the word line of this additional row. As regards the position of this first reference memory cell in the first additional column, it would be possible to place it at the end of this first additional column and at the far end from the means for detecting its contents. This being so, as will be seen in detail below, it turns out to be particularly advantageous to arrange this first reference memory cell at the bottom of the first additional column, that is, in the vicinity of the means for detecting the reading of its contents. Under these conditions, the additional row of line memory cells is also placed at the bottom of the memory plane and is spaced by the height of a column of the memory plane from the additional means of line selection. The connection between these means of additional line selection and the additional row is then provided by internal wiring within the line decoder.

Moreover, the column capacitance of the first additional column has a predetermined known value with respect to the column capacitance of each column of the memory plane. The column capacitance is produced, in particular, by the stray capacitances of the metallizations of which it is composed. This column capacitance of the first additional column thus makes it possible to compare the voltage difference at the terminals of the metallizations of which it is composed, with a predetermined reference voltage (for example VDD/2) corresponding with respect to the amplifiers of the read circuit of the memory plane to a voltage greater than the offset voltage.

One approach can include producing a first additional column identical, from a capacitive point of view, to each column of the memory plane. The approach can also include, for the means of detecting the reading of the contents of the first reference memory cell, an actual comparator which receives, on one of its inputs, a reference voltage from a voltage source. It receives on its other input, the voltage emanating from one of the metallizations of the first additional column. The reference voltage from the voltage source would then be chosen to be greater than the offset voltage of the amplifiers, for example, on the basis of technological or trial data.

This being so, such an approach has the drawback that it requires the production of an actual voltage source. The invention advantageously therefore makes provision for producing a column capacitance of the additional column which is lower than the column capacitance of a column of the memory plane. Thus, this lower capacitance makes it possible to obtain a voltage difference between the two metallizations of the additional column while reading and to compare this voltage difference with a reference voltage. The reference voltage is much greater than that of the offset voltage of the amplifiers.

Thus, according to one mode of implementation of the invention, the column capacitance of the additional column is taken to be equal to a sub-multiple of the column capacitance of a column of the memory plane. The contents of the first reference cell are thus detected by comparing the voltage difference at the terminals of the additional column with a first reference voltage (for example VDD/2) corresponding to a second reference voltage (for example 100 mV) greater than the offset voltage of the amplification means of the read circuit. This is so when the ratio between the column capacitance of a column of the memory plane and the column capacitance of the additional column are taken into account.

Thus, if a sufficient capacitive ratio is chosen between the column capacitance of the first additional column and the capacitance of each column of the memory plane, it will advantageously be possible to use a CMOS inverter for the detection of this value VDD/2. This is so if the capacitive ratio is chosen in such a way that a voltage difference of 100 mV, for example, at the terminals of the amplifier of the read circuit (voltage greater than its offset) corresponds to a voltage difference equal to VDD/2 at the first additional column.

Another problem associated with the circuit for reading the memory devices lies in determining the instant of deactivation of the read amplifiers, that is, the instant at which the reading of the contents of the selected memory cell is stopped. This is because the duration of reading the contents of a memory cell must be limited for reasons of power consumption.

The invention overcomes this problem by selecting, using the additional line selection signal, a second reference memory cell structurally analogous to the memory cells of the memory plane and of predetermined contents. This second reference memory cell is placed at the intersection of the additional row and of a second additional column of column memory cells. This is arranged in the exterior vicinity of the first additional column and is configured in such a way as to exhibit a column capacitance equal to that of each column of the memory plane.

The reading of the contents of this second reference cell is then detected in a zone of the second additional column spaced by a distance substantially equal to the height of a column of the memory plane from the site of generation of the additional selection signal. Again this is done for the purpose of keeping conditions of horizontal and vertical propagation analogous to those of the rows and columns of the memory plane. The read circuit is then deactivated only if the detection occurs, so as to halt the reading of the contents of the selected memory cell or cells of the memory plane.

Stated otherwise, once it is certain that it has been possible correctly to read the contents of the second reference memory cell, it is then certain that the selected cell or cells of the memory plane have been able to be read correctly. It is then possible to deactivate the amplification means of the read circuit.

The subject of the invention is also a memory device, comprising a memory plane, line selection means (line decoder) for selecting a line row of memory cells of the memory plane on the basis of a selection signal, column selection means (column decoder) for selecting at least one column of memory cells, a read circuit linked to the column selection means, and control means for controlling the selection means and the read circuit. According to a general characteristic of the invention, the memory device furthermore comprises:

additional means of line selection (additional line decoder) for delivering an additional selection signal, an additional row of line memory cells, this additional row, arranged in the exterior vicinity of the memory plane, including a first end linked to the output of the additional means of line selection and being configured in such a way as to exhibit signal propagation conditions analogous to those of each row of the memory plane, a first reference memory cell, structurally analogous to the memory cells of the memory plane and of predetermined contents, placed at the intersection of the additional row and of a first additional column of column memory cells, this first additional column being arranged in the exterior vicinity of the memory plane and configured in such a way as to exhibit a column capacitance of predetermined value known with respect to the value of the column capacitance of each column of the memory plane, and first additional means of column selection for selecting the said first additional column. In practice, these additional means of column selection may simply include a pair of control transistors which are always on.

Moreover, the control means comprise first detection means arranged in a zone of the first additional column spaced substantially by the height of a column from the output of the additional means of row selection, so as to deliver a first detection signal indicative of the reading of the contents of the first reference cell. The control means are then able simultaneously to activate the line selection means and the additional means of line selection, as well as simultaneously being able to activate the column selection means and the first additional means of column selection. The control means are then able to activate the read circuit when the first detection signal occurs so as to allow the reading of the contents of the selected memory cell or cells of the memory plane.

According to one embodiment of the invention, the column memory cells of the first additional column are all linked to first column metallization means, and each column memory cell is linked to the end of a word line of the memory plane. The first column metallization means are advantageously interrupted so as to subdivide the column memory cells of the first additional column into a first group of column memory cells which are connected to the reference memory cell and to the detection means and into a second group of column memory cells which are not connected to the first reference memory cell and to the first detection means. The number of column memory cells of the first group is predetermined in such a way that the column capacitance seen by the detection means is taken to be equal to a chosen sub-multiple of the column capacitance of a column of the memory plane.

In this way a column capacitance of the first additional column which is much lower than that of each column of the memory plane is advantageously and very simply produced. This makes it possible very advantageously to use a CMOS inverter so as to detect a reference voltage equal to VDD/2, indicating to the amplifiers of the read circuit that the voltage difference at their terminals is then greater than their offset voltage.

According to one embodiment of the invention, the additional row of line memory cells is arranged between the last row of the memory plane and the column selection means.

The line selection means are arranged between the additional means of line selection and the additional row. Stated otherwise, the additional line decoder is then spaced by the height of a column of the memory plane from the additional row. The connection between this additional line decoder and the additional line of line memory cells is then effected with the aid of an internal connection in the line decoder. Therefore, the first reference memory cell is situated at the bottom of the memory plane and the first group of column memory cells of the first additional column. In other words, the column memory cells which are directly connected to the reference memory cell and to the detection means, are then arranged between this first reference memory cell and the second group of column memory cells. The second group of column memory cells are the column memory cells which are not connected to the detection means by virtue of the interruption of the metallization of this first additional column.

The first reference memory cell is advantageously structurally analogous and topologically analogous (that is, possessing the same layout) to each memory cell of the memory plane. The first reference memory cell furthermore comprises a specific internal connection making it possible to freeze the value of the stored bit. Likewise, each line memory cell of the additional row is structurally and topologically analogous to each memory cell of the memory plane, but functionally inactive with regard to the memory cells of that column of the memory plane at the end of which it is arranged. Indeed, each line memory cell should contribute to obtaining, for the additional row, conditions of horizontal propagation which are identical to that of each row of the memory plane. Each line memory cell should not disturb the reading of a memory cell of the memory plane which might be selected. As will be seen in greater detail below, one way of rendering each line memory cell functionally inactive with regard to the memory cells of the corresponding column includes not linking the access transistors of this line memory cell to the metallizations of the column at the end of which it is situated.

Likewise, each column memory cell of the first additional column connected to the detection means is structurally and topologically analogous to each memory cell of the memory plane but functionally inactive with regard to the first reference memory cell. This is in such a way as not to disturb the reading of the contents of the first reference memory cell.

According to one embodiment of the invention, the column memory cells of the second group of the first additional column, that is, those which are not linked to the first reference memory cell by virtue of the discontinuity of the means of metallization of this first additional column are structurally identical to the line memory cells of the additional row. This makes it possible not to disturb the capacitive environment of the memory cells of the memory plane which are adjacent to these column memory cells of the second group.

So as to detect the instant of stoppage of the reading of the contents of the selected memory cells of the memory plane, there is advantageously provision for the device according to the invention to comprise:

a second reference memory cell, structurally analogous to the memory cells of the memory plane and of predetermined contents, placed at the intersection of the additional row and of a second additional column of column memory cells. This second additional column is arranged in the exterior vicinity of the first additional column and is configured in such a way as to exhibit a column capacitance equal to that of each column of the memory plane. Each column memory cell of the second additional column is structurally and topologically analogous to each memory cell of the memory plane, but functionally inactive with regard to the second reference memory cell (this again so as to avoid disturbing the reading of the contents of this second reference memory cell), second means of additional column selection for selecting the second additional column. In practice, in a manner analogous to the first additional means of column selection, these second additional means of column selection may also simply include a pair of control transistors which are always on.

The control means then comprise second detection means, in practice an amplifier analogous to that or those of the read circuit of the memory plane, arranged in a zone of the second additional column spaced substantially by the height of a column from the output of the additional means of line selection (additional line decoder). The second detection means then deliver a second detection signal indicative of the reading of the contents of these second reference cells.

Functionally, the control means are then able simultaneously to activate the line selection means and the additional means of line selection, as well as simultaneously to activate the column selection means and the first and second additional means of column selection. Then, the control means deactivate the read circuit when the second detection signal occurs so as to halt the reading of the contents of the selected memory cell or cells of the memory plane.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 1:
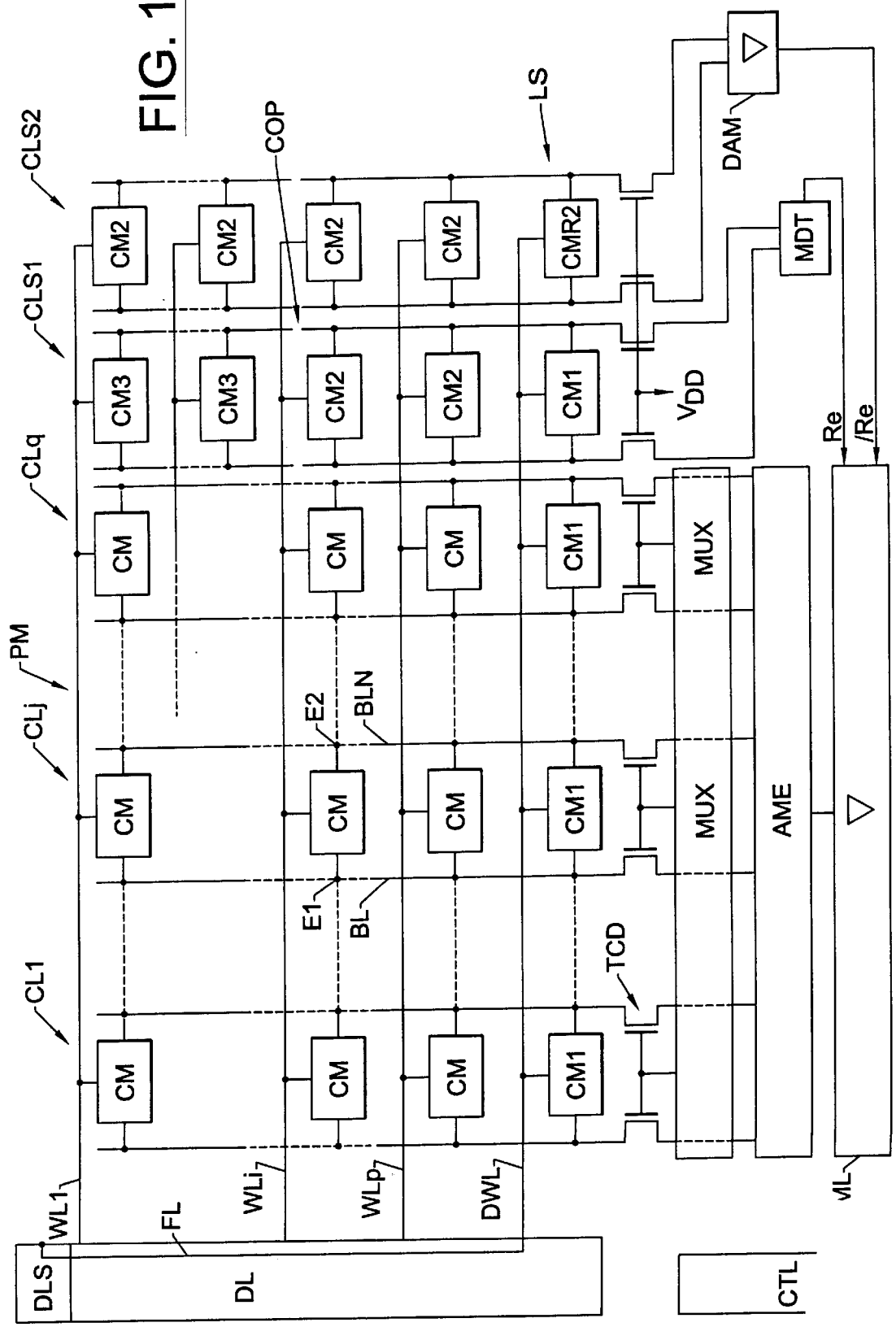
FIG. 1 is a diagrammatic schematic of an embodiment of a memory device according to the invention, FIG 2 diagrammatically illustrates an example of an embodiment of a memory cell of the memory plane of the device of FIG. 1, FIG 3 diagrammatically illustrates the internal architecture of a reference memory cell, FIG. 4 diagrammatically illustrates the internal architecture of a line memory cell of the additional row of memory cells, and FIG. 5 diagrammatically illustrates the internal architecture of a column memory cell of an additional column of the memory device according to the invention.

Represented in FIG. 1 is a dynamic random-access memory device according to the invention, whose memory plane PM comprises a block of memory cells CM organized in rows (lines) and columns. In the example described, it is assumed that the memory block comprises p lines and q columns. Each memory cell CM comprises two inputs E1 and E2 respectively connected to two adjacent metallizations of columns BL and BLN, so as to receive control voltages for the reading and writing of the data stored in the memory cell.

Moreover, in a conventional manner, each memory cell is selected by a signal WL conveyed by a line metallization WL or "word line". The memory device comprises, in a conventional manner, circuits associated with the memory plane PM and intended to read, write or refresh this memory plane. These circuits comprise a line decoder DL whose outputs are linked to the various word lines WLi so as to deliver the corresponding selection signals WLi. Also provided for is a column decoder associated with control transistors TCD controlled pairwise so as to select one or more columns CLj. Thus, in the read and write phase, the combination of the selection of a word line WLi and of columns CLj makes it possible to select a memory word of the memory plane, contained in the same word line. The transistors TCD are also linked, in a conventional manner, to a write amplifier AME, as well as to a read amplifier AML, or read circuit, whose construction is known by those skilled in the art.

Apart from the memory plane PM, the memory device according to the invention comprises an additional line or row LS and two additional columns CLS1 and CLS2. The additional line LS is arranged alongside the $p^{th}$ line of the memory plane between this $p^{th}$ line and the control transistors TCD and includes a line memory cells CM1, as well as two reference memory cells CMR1 and CMR2 arranged at the end of this additional line LS.

All the memory cells of this additional line LS are selected by a signal DWL likewise conveyed by a line metallization DWL, or word line, linked to additional means of line selection DLS (additional line decoder) which are arranged at the upper end (in FIG. 1) of the line decoder DL. The additional line decoder DLS generating the signal DWL is linked to the word line DWL by an internal connection FL to the line decoder DL. The person skilled in the art will observe in FIG. 1 that the additional word line DWL is spaced by the height of a column of the memory plane from the additional line decoder DLS.

The first additional column CLS1 is arranged outside the memory plane PM alongside the $q^{th}$ column CLq and comprises column memory cells CM2 and CM3 respectively connected, in a manner analogous to the other columns of the memory plane, to two adjacent column metallizations. The first reference cell CMR1 is therefore situated at the intersection of the additional line LS and of the first additional column CLS1.

All the column memory cells of this first additional column CLS1, as well as the first reference memory cell CMR1 are respectively connected to the word lines WL1–WLp and DWL. Moreover, the two column metallizations of this first additional column CLS1 are interrupted at a predetermined site COP so as to subdivide the column memory cells of this first additional column into two groups. The first group comprises the column memory cells CM2 which are connected to the first reference cell CMR1, as well as to detection means MDT, whose structure and function will be returned to in greater detail later.

On the other hand, the second group of column memory cells CM3 which are not connected to the first reference cell CMR1 and therefore to the detection means MDT is situated in the upper part of the first additional column CLS1. In fact, as will be seen in greater detail below, this cutting COP of the column metallizations makes it possible to reduce the column capacitance of the first additional column CLS1 with respect to the column capacitance of a column CLj of the memory plane PM.

The second additional column CLS2 is arranged in the exterior vicinity of the first additional column CLS1 and is distinguished from the first column CLS1 by the fact that, this time, the two column metallizations are not interrupted. The column memory cells forming this second additional column CLS2 are column memory cells CM2 which, as will be seen in greater detail below, afford this second additional column CLS2 a column capacitance identical to that of a column CLj of the memory plane PM. The second reference memory cell CMR2 is situated at the intersection of the additional line LS and of this second additional column CLS2.

The second reference memory cell CMR2 is linked by way of control transistors TCD and of second detection means DAM formed in the illustrated embodiment by an amplifier identical to that of the read circuit AML. As will be seen in greater detail below, the first detection means MDT will deliver an activation signal Re making it possible to read the contents of the selected memory cells in the memory plane. This is so while the second detection means DAM will deliver a second detection signal/Re (Not Re) to the amplifiers of the read circuit so as to halt the reading of the contents of the selected memory cells.

Control means CTL, whose construction will be readily appreciated by those skilled in the art, deliver, in particular, control signals to the line decoder DL making it possible to select a particular word line WLi in the read or write phase. These control means also control the column decoder MUX so as to select a word in the memory plane. The person skilled in the art will observe here that the arrangement of the memory device according to the invention also makes it possible, each time one or more columns of the memory plane is selected, to select the first and the second additional column CLS1 and CLS2. This is because the gates of the four transistors TCD associated with the first and second additional columns are linked to VDD, rendering these transistors always on. Likewise, according to the invention, the structure of the additional line decoder DLS is contrived in such a way as to deliver, with each selection of a line of the memory plane PM, the additional selection signal DWL so as also and simultaneously to select the additional line LS. The person skilled in the art will readily be able to construct the circuit DLS on this basis, in particular, of logic gates.

Before returning in greater detail to the role and operation of the additional line LS and of the two additional columns CLS1 and CLS2, the internal structure and the operation of a memory cell CM of the memory plane will now be described. The memory cell CM of the memory plane which will be described is a cell with four transistors. However, the invention is not limited to such a memory cell, and may be applied to any type of memory cell irrespective of the number of transistors used.

Figure 2:
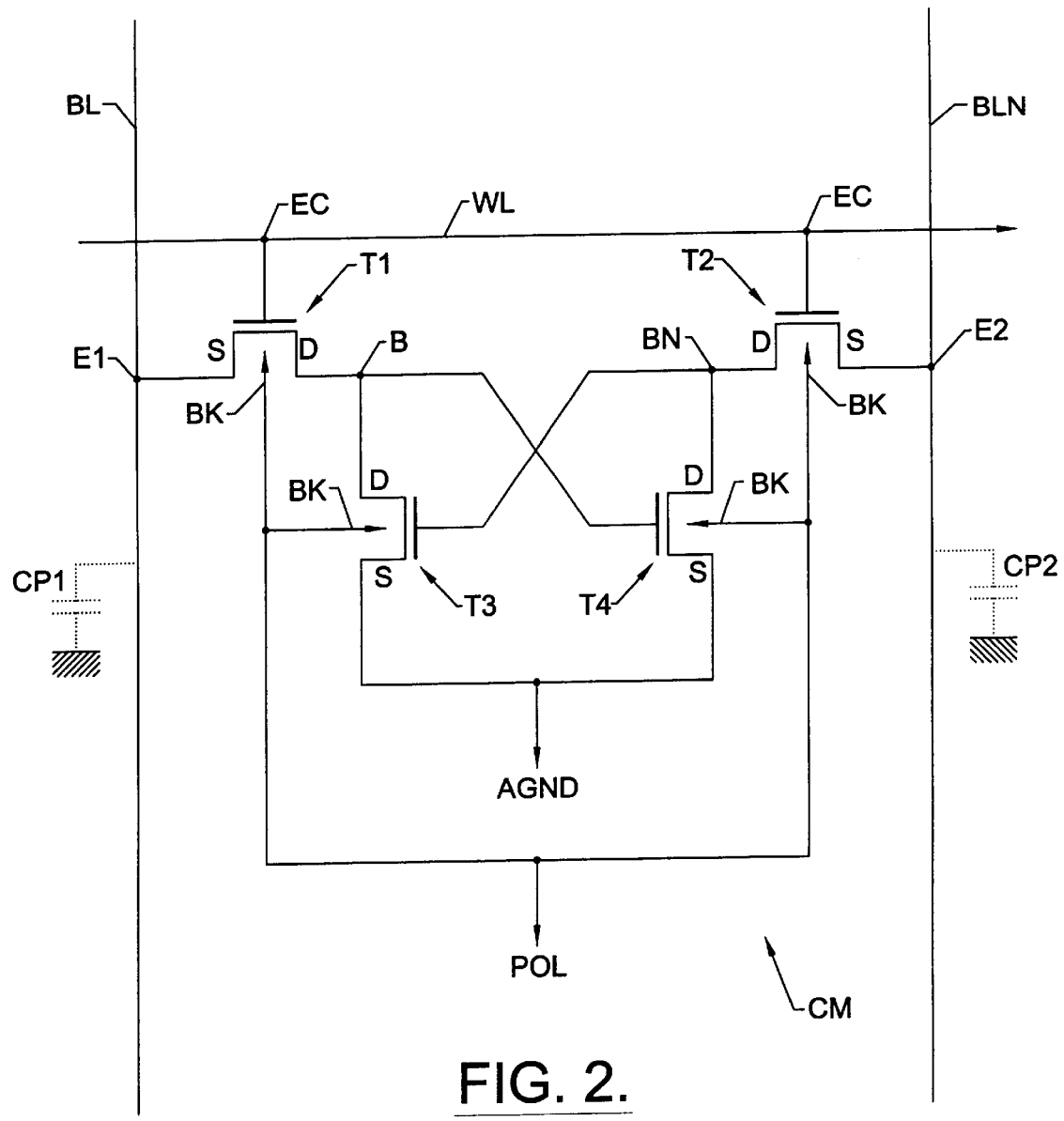

Each memory cell CM (FIG. 2) comprises two NMOS access transistors, labelled T1 and T2 respectively, whose respective gates are connected to the word line WL, the corresponding nodes EC thus forming a selection input for this memory cell. In addition to the two access transistors T1 and T2, the memory cell CM comprises two NMOS storage transistors T3 and T4. The capacitance for storing the data in memory is formed by the gate/source capacitance of a storage transistor. The gate of the transistor T4, as well as the drain of the transistor T3, are linked to the drain of the access transistor T1, the corresponding node being labelled B.

Similarly, the gate of the storage transistor T3, as well as the drain of the storage transistor T4, are linked to the drain of the access transistor T2, the corresponding node being labelled BN. The respective sources and access transistors T1 and T2 are linked respectively to the two control inputs E1 and E2. Lastly, the sources of the two storage transistors T3 and T4 are both linked to a first predetermined bias voltage AGND.

Furthermore, the substrate BK of each transistor of the memory cell, or indeed the well BK of this transistor if the latter is disposed inside a well, is advantageously linked to a second bias voltage POL. This being so, it is particularly advantageous for the transistors of the memory cell CM to be placed in a well (or even in a double well) constructed within a semiconductor substrate. This embodiment has the advantage of offering less current leakage, of being less sensitive to the "noise" originating from the substrate, and of being less sensitive to alpha particles.

To limit the losses of charge from the storage capacitors of the storage transistors, and consequently to increase the retention time of a stored data, the voltages POL and AGND are advantageously chosen in such a way that these voltages satisfy the following relation:

$$-VT \leq POL - AGND \leq 0$$

in which VT denotes the threshold voltage of the transistors.

Such a relation between the voltage POL and the voltage AGND in fact leads to a positive "source-substrate" potential difference. This, bearing in mind the "substrate effect" which is well known to those skilled in the art, leads to an increase in the threshold voltage and consequently to an increase in the retention time.

In the example described above, with $0.35\mu$ technology and a zero AGND voltage, a voltage POL substantially equal to $-VDD/10$ will be chosen, that is, substantially equal to $-0.3$ V. In the case in which the memory cell is constructed from PMOS transistors, the bias voltage AGND is then replaced by the bias voltage AVDD, for example 3 V. In this case, again to increase the data retention time by using the "substrate effect", the voltages AVDD and POL will be chosen in such a way that:

$$VDD + VT \geq POL - AVDD \geq 0.$$

To illustrate the write operation of the memory cell CM of the line of rank i and of the column of rank j, it is assumed that it is desired to write a logic "1". The cell CM is selected on the one hand by activating the logic signal WLi (WLi=1) on the basis of a specific control word and on the other hand by selecting the column CLj. Voltages equal to VDD and 0 respectively are applied to the metallizations BL and BLN of the column CLj.

Since the access transistors T1 and T2 are on, the voltage at the node B is equal to VDD−VT, while the voltage at the node BN is zero. The storage transistor T3 is therefore off while the storage transistor T4 is on. The logic "1" value is consequently stored in the gate/source capacitance of the transistor T4. It should be noted here that since the transistor T3 is off, the voltage at the node B tends to keep its high value (disregarding the leakages from stray currents, of course). Similarly, since the transistor T4 is on, the voltage at the node BN tends to be maintained at its zero level. Consequently, those skilled in the art will appreciate here the feature of stability of the memory cell during the write phase. Subsequently, the signal WL is deactivated and the data is then regarded as written.

To write a logic "0", a zero voltage is applied to the metallization BL and a high-level voltage (VDD) is applied to the metallization BLN. It is then the gate/source capacitance of the transistor T3 which stores a charge resulting from the application of the high-level voltage to the node BN.

The operation of the memory cell in read mode will now be described. In the example which will be described, it will be assumed that a logic "1" has previously been stored in the memory cell. In a conventional manner, the first step includes precharging the metallizations BL and BLN of the column Clj to a high voltage level, in this instance VDD if the precharge circuit comprises PMOS transistors or else to VDD−VT if the precharge circuit comprises NMOS transistors.

It is also assumed that, because of the leakages in the substrate, the potential at the node B has suffered a voltage drop relative to the initial level VDD−VT which was applied to it when writing the logic data. After deactivating the precharge, the line selection signal WLi is activated, this having the effect of turning on the two access transistors T1 and T2.

Consequently, a transfer of the charge from the stray capacitor CP1 of the metallization BL to the node B occurs immediately, the effect of this being to take the potential of this node B to its initial value VDD−VT. The smaller the ratio of the gate/source storage capacitance to the stray capacitance CP1 (or CP2), for example, less than ⅕₀, the shorter is the duration of transfer. This memory cell has the noteworthy property that the data stored is automatically and almost immediately refreshed at the start of a read cycle. It is therefore unnecessary to provide for a specific read re-write cycle to refresh the stored data.

Moreover, after activation of the signal WLi, there is a fall in the potential of the metallization BLN relative to the potential of the metallization BL and this leads to a potential difference ΔV, the reading of the sign of which makes it possible to determine the logic value of the data stored in the memory cell. When the signal WLi is activated, a transient voltage spike occurs at node BN. It is vital here to prevent this voltage spike from being too large and, in particular, greater than or equal to the threshold voltage of the storage transistors so as to prevent the transistor T3 from coming on. The effect of the transistor T3 coming on would be to cause the voltage at the node B to drop and the transistor T4 to turn off, ultimately leading to a loss of the information stored, to a refreshing of the data in the "wrong direction", and consequently to the reading of a data whose logic value is the inverse of that which had previously been written.

This is why the ratio $$R = \frac{W1}{L1} \bigg/ \frac{W2}{L2}$$

must be greater than or equal to 1 and preferably greater than or equal to 2. W1 and L1 respectively denote the channel width and length of the storage transistors while W2 and L2 denote the channel width and length of the access transistors. By way of illustration for $0.35\mu$ CMOS technology, we shall preferably choose $W1=1.4\mu$, $L1=0.4\mu$, $W2=0.8\mu$ and $L2=0.5\mu$ thus leading to a ratio R on the order of 2.2. The duration of the read cycle of such a memory cell is typically of the order of 30 ns. The information refresh duration is much shorter, typically on the order of 5 ns for a gate/source storage capacitance on the order of a few femtofarad and a stray bit line capacitance on the order of a few hundred femtofarad.

Generally, when the ratio between the stray capacitance CP1 (or CP2) of a column metallization BL (or BLN) and the gate/source storage capacitance is sufficiently high, for example greater than 50, and better still greater than 100, the memory cell exhibits the remarkable property of refreshing the data stored in this cell in an extremely short time. This is because the duration of charge transfer to the storage capacitance is then very small relative to the duration of discharge of the stray capacitance of the column metallization.

The difficulty with conventional memory devices is in evaluating the instant at which the voltage difference ΔV is greater than the offset of the amplifier of the read circuit AML. The reading of the sign of the voltage difference ΔV makes it possible to detect the logic value of the stored data of the selected memory cell.

The invention overcomes this difficulty in an automatic and transparent way by the automatic selection, with each selection of a word line WLi of the memory plane, of the first reference memory cell CMR1, and by the detection of the reading of its contents. Indeed, by virtue of the position of this first reference memory cell with respect to the position of the additional line decoder DLS, the time of horizontal and vertical propagation between the instant of generation of the additional selection signal DWL and the instant of detection of the reading of the contents of this first memory cell CMR1 by the detection means MDT, is greater than the duration separating the instant of generation of the selection signal WL1 and the instant of the start of the reading of the contents of the memory cell CM placed at the intersection of line 1 and column CLq.

Since, when a word line WLi of the memory plane is activated so as to select some of the cells CM of the memory plane, the corresponding cells CM1 of the additional line LS are simultaneously activated. This line must be configured in such a way as to exhibit a horizontal propagation of the signal DWL which is identical to that of the signal WLi. In contrast, the selected cells CM1 must not be active vertically, that is, they must not disturb the reading of the contents of the selected cells CM.

Figure 4:
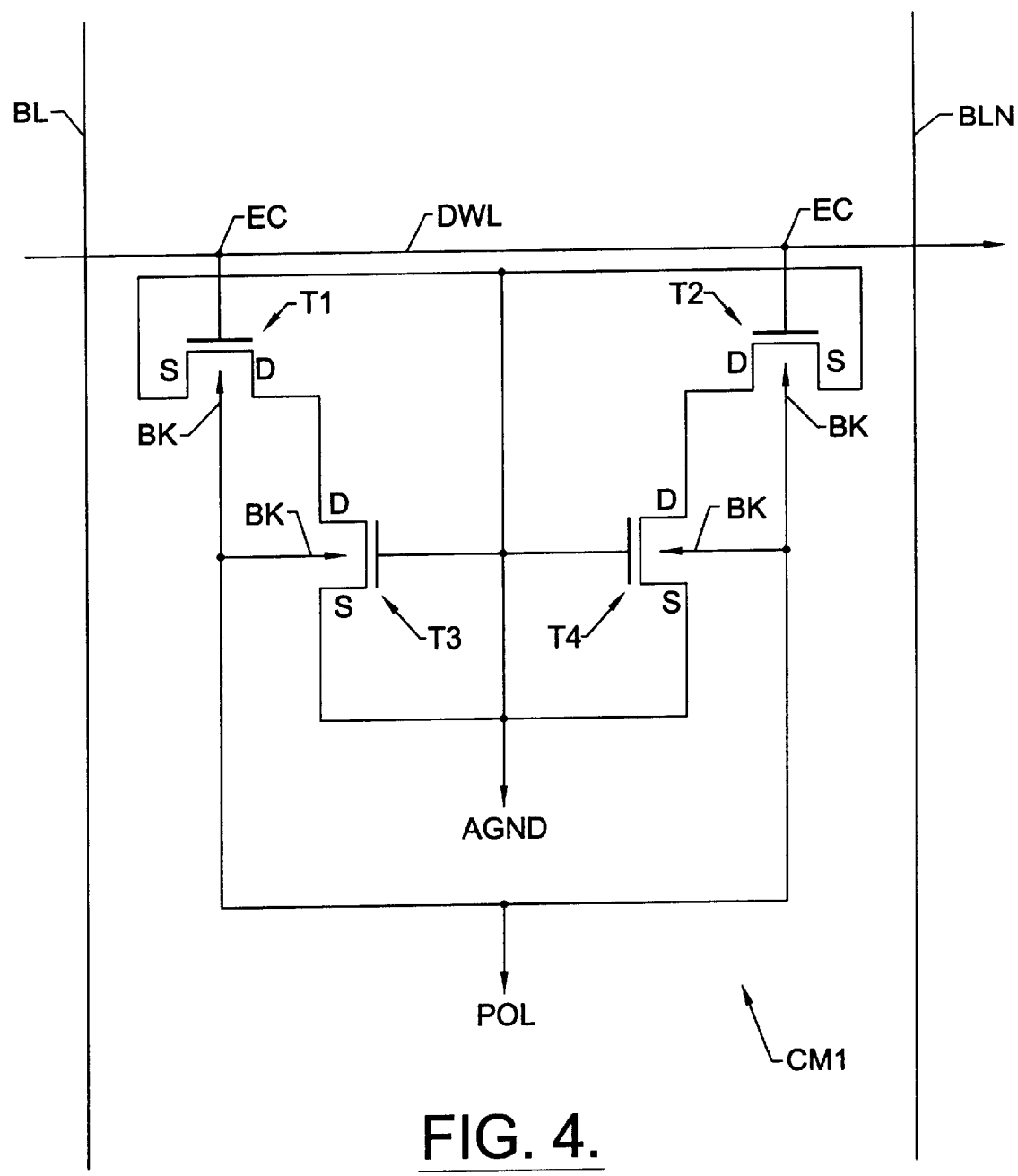

The conditions of horizontal propagation depend on the capacitive load seen by the additional selection signal DWL, on the gate capacitance of the access transistors of the memory cells. This is why, in general, memory cells CM1 will be chosen which are structurally analogous to the cells CM of the memory plane and are constructed in particular on the basis of the same layout. The structure of such a memory cell CM1 is illustrated in FIG. 4. It will be noted in particular that, unlike in the case of the cells CM, the access transistors T1 and T2 are not linked to the column metallizations BL and BLN. This has been illustrated in the present case for a memory cell with four transistors, but this property is valid irrespective of the number of transistors used in the memory cells. To avoid a floating connection, the sources of the transistors T1 and T2 are linked to the voltage AGND. Likewise, the storage transistors T3 and T4 are rendered inactive by connecting their gates to the voltage AGND.

Figure 5:
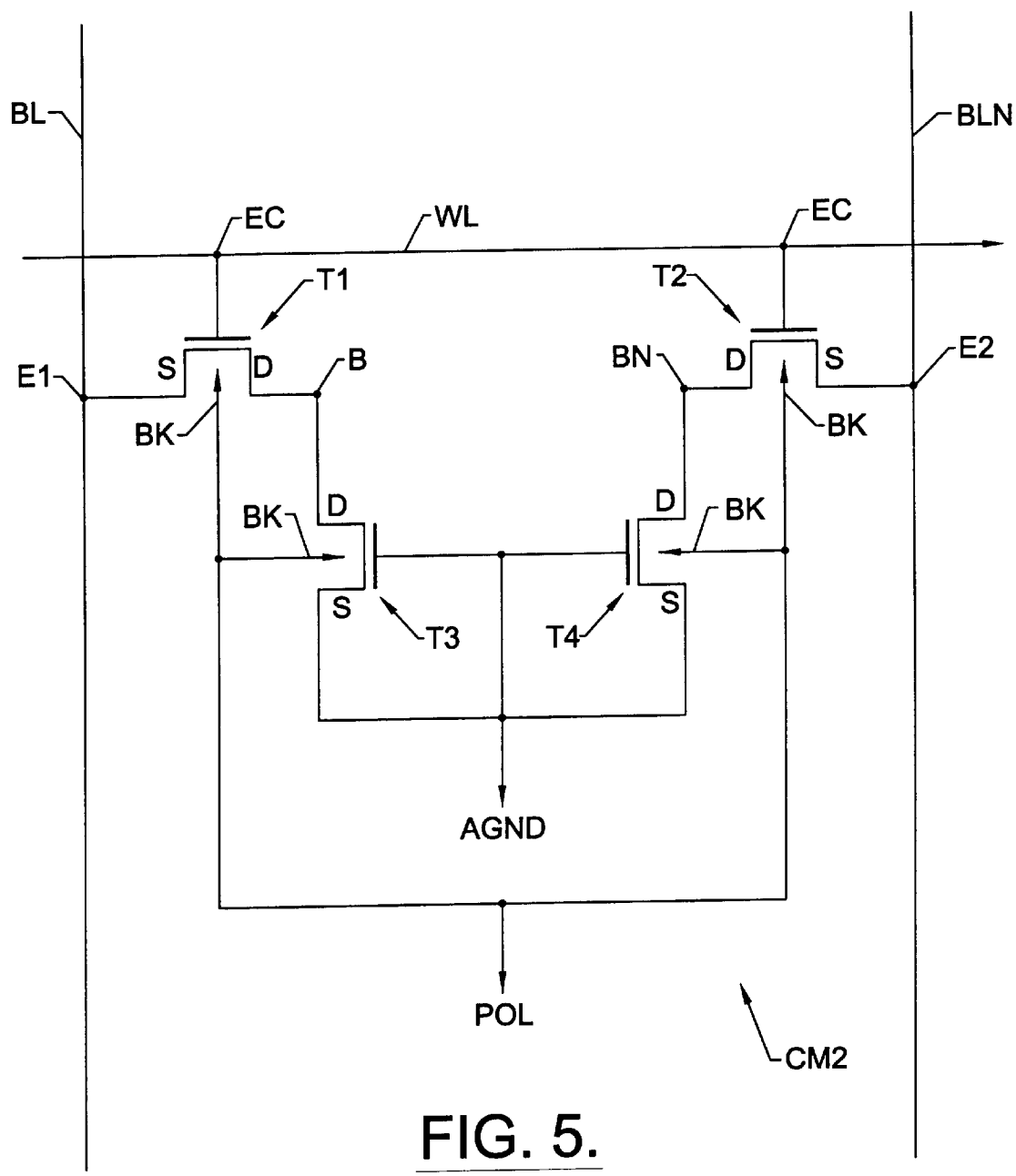

As far as the column memory cells CM2 of the first group are concerned, that is, those which are actually linked by way of the column metallizations to the first reference cell CMR1, they must also be structurally analogous to the memory cells CM of the memory plane. However, they must be functionally inactive with regard to the first reference memory cell, so as not to disturb the reading of the contents of this reference cell CMR1. On the other hand, this time these cells CM2 must actually be linked to the metallizations BL and BLN of the column CLS1 so as to contribute to the capacitive column load. The structure of such a cell CM2 is illustrated in FIG. 5. It may be seen that it differs simply from the structure of a memory cell CM of the memory plane through the fact that the gates of the storage transistors T3 and T4 are linked to the voltage AGND, rendering these storage transistors always off. Here again, this characteristic including rendering the storage transistors always off is valid irrespective of the type of memory cell used.

Moreover, given that the number of memory cells actually connected to the two metallizations of the column CLS1, that is, the cells CM2 plus the cell CMR1, is less than the number of cells CM of a column of the memory plane, the column capacitance of the first column CLS1 is lower than that of a column of the memory plane. In fact, the number of cells CM2 of the column CLS1 is chosen in such a way that the column capacitance of the column CLS1 is equal to a sub-multiple of the column capacitance of a column CLj of the memory plane. Thus, if by simulation with regard to a single memory slot, it has been noted that a voltage difference of 100 mV for example, was greater than the offset voltage of an amplifier of the read circuit, the ratio between the column capacitance of the column CLS1 and the column capacitance of a column CLj of the memory plane is then chosen in such a way that this voltage difference of 100 mV corresponds at the level of column CLS1 to a much higher voltage difference, for example equal to VDD/2.

Thus, when the voltage difference at the terminals of the two metallizations of the column CLS1 reaches this reference voltage equal to VDD/2, it is certain that the voltage ΔV at the terminals of the selected column of the memory plane PM is greater than the offset voltage of the read amplifier. It is therefore also possible to activate this read amplifier with the signal Re delivered by the first detection means MDT. By choosing a comparison voltage equal to VDD/2 at the level of the first additional column CLS1 it becomes possible to use a CMOS inverter, in a very simple manner, to construct the detection means MDT. In fact, in the present case, two inverters in series will be used so as to obtain a signal Re active in the high state. Furthermore, it will advantageously be possible also to append a latch memory in series with the inverters so as to guarantee stability of the signal Re and avoid, in particular, swings in the latter.

Figure 3:
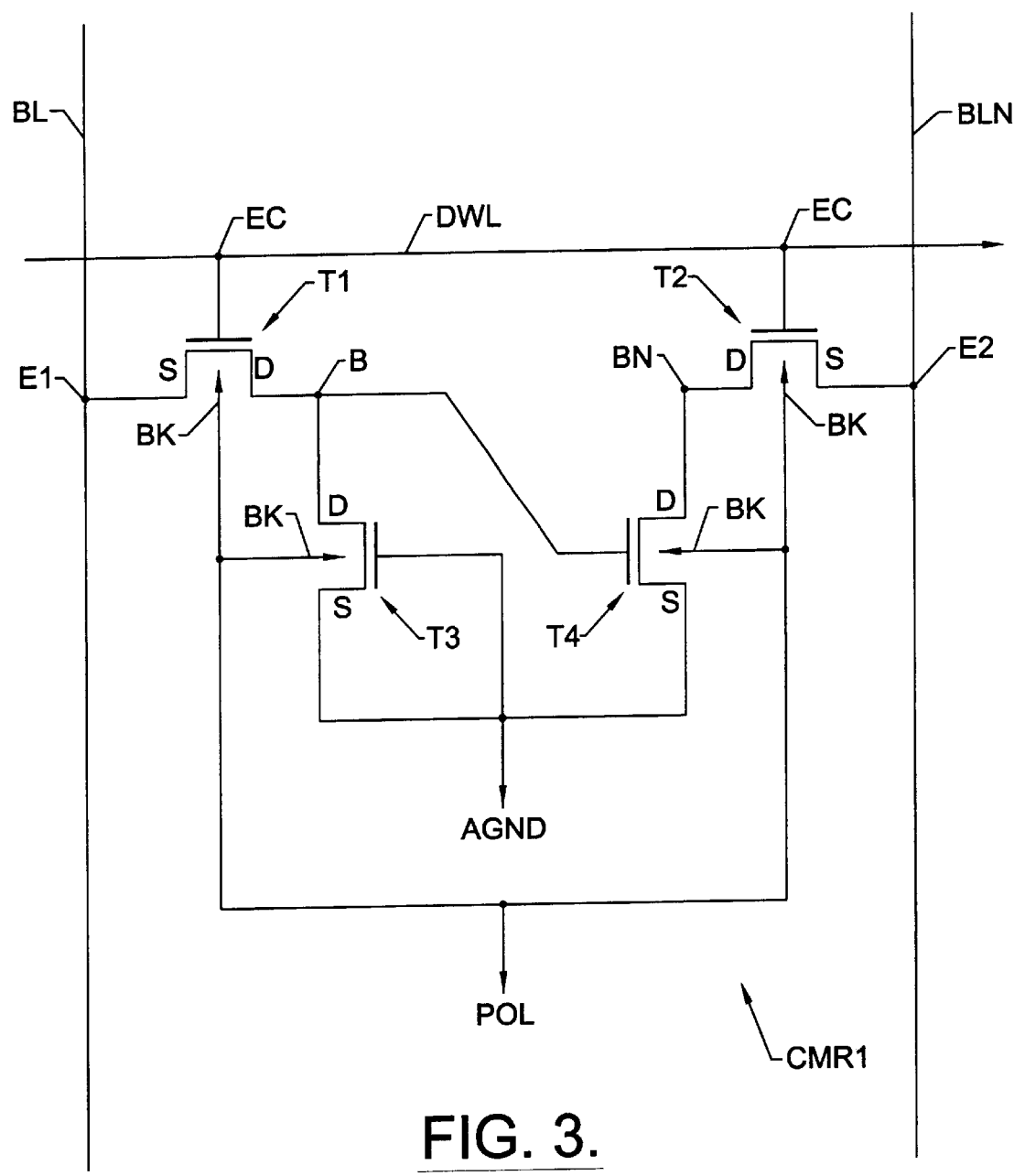

Knowledge of the predetermined contents of the first reference memory cell CMR1 (that is, the fact that it stores either a logic 0 or a 1) makes it possible to position the CMOS inverters on either of the metallizations BL or BLN depending on the value of these contents. FIG. 3 illustrates a representation of the cell CMR1. It may be seen that it is structurally analogous to a cell CM of the memory plane. However, its internal contents are frozen by a specific connection. In this instance, one of the storage transistors is always off while the other will always be on. This is achieved as shown in FIG. 3 by replacing the connection of the gate of the transistor T3 to the node BN by a direct connection to the voltage AGND.

The memory cells CM3 of the first additional column CLS1, that is, those which are not linked to the first reference memory cell CMR1, are used here so as not to disturb the capacitive environment of the last column CLq of the memory plane. They are, for example, chosen to be analogous to the memory cells CM1 of the additional line LS.

The second additional column CLS2 includes a second reference memory cell CMR2 identical to the first reference memory cell CMR1 as well as of column memory cells CM2 which this time are all connected to the two column metallizations BN and BLN. The column capacitance of the second column CLS2 is therefore identical to that of a column capacitance of the memory plane.

Second detection means DAM, illustratively including an amplifier identical to that of the read circuit AML, are linked to the two metallizations of this column CLS2 by way of two transistors TCD. When the predetermined contents of the second reference memory cell CMR2 have been detected by the second detection means DAM, the latter deliver a signal for deactivating the amplifiers of the read circuit AML (signal/Re). This embodiment advantageously makes it possible to optimize the duration of reading of the contents of the selected memory cells CM of the memory plane.

In general, the additional circuitry is advantageously constructed and contrived in such a way as not to disturb the environment of the memory plane, especially the capacitive environment. This is why the same "layout" will be used for the appended memory cells, and the additional row 25 will be placed at the bottom of the memory plane and a connection FL internal to the line decoder DL will preferably be used to link the additional line decoder DLS to this additional row.

That which is claimed is:

1. A process for controlling a read circuit of a memory array comprising the steps of:

selecting at least one memory cell of a row of the memory array by generating a selection signal for the corresponding word line of the row, while generating an additional selection signal propagated over an additional word line of an additional row of memory cells, this additional row being arranged in an exterior vicinity of the memory array and configured to exhibit conditions of propagation of the additional signal which are analogous to those of each row of the memory array;

using the additional selection signal to select a first reference memory cell structurally analogous to the memory cells of the memory array and having predetermined contents, the first reference memory cell being placed at an intersection of the additional row and of a first column of column memory cells which is arranged in the exterior vicinity of the memory array and is configured to exhibit a column capacitance of predetermined value with respect to a value of column capacitance of each column of the memory array;

detecting a reading of the contents of the first reference cell in a zone of the additional column which is spaced substantially by a height of a column of the memory array from a site of generation of the additional selection signal; and activating the read circuit only if the detection occurs so as to allow the reading of the contents of the selected memory cell or cells of the memory array.

2. A process according to claim 1, wherein the column capacitance of the additional column is substantially equal to a sub-multiple of the column capacitance of a column of the memory array; and wherein the step of detecting comprises comparing a voltage difference at terminals of the additional column with a first reference voltage corresponding, with regard to a ratio between the column capacitance of a column of the memory array and the column capacitance of the additional column, to a second reference voltage greater than an offset voltage of an amplifier of the read circuit.

3. A process according to claim 1, further comprising the step of using the additional selection signal to select a second reference memory cell structurally analogous to the memory cells of the memory array and having predetermined contents, the second reference memory cell being placed at the intersection of the additional row and of a second additional column of column memory cells which is arranged in the exterior vicinity of the first additional column and is configured to exhibit a column capacitance substantially equal to that of each column of the memory array.

4. A process according to claim 3, further comprising the step of detecting a reading of the contents of the second reference cell in a zone of the second additional column spaced substantially by the height of a column of the memory array from the site of generation of the additional selection signal.

5. A process according to claim 4, further comprising the step of deactivating the read circuit only if the detecting of a reading of the contents of the second reference cell occurs so as to halt the reading of the contents of the selected memory cell or cells of the memory array.

6. A process for controlling a read circuit of a memory array comprising the steps of:
selecting at least one memory cell of a row of the memory array by generating a selection signal for the corresponding word line of the row, while generating an additional selection signal propagated over an additional word line of an additional row of memory cells, this additional row being arranged in an exterior vicinity of the memory array and configured to exhibit conditions of propagation of the additional signal which are analogous to those of each row of the memory array;
using the additional selection signal to select a first reference memory cell structurally analogous to the memory cells of the memory array and having predetermined contents, the first reference cell being placed at an intersection of the additional row and of a first column of column memory cells which is arranged in the exterior vicinity of the memory array and is configured to exhibit a column capacitance of predetermined value with respect to a value of column capacitance of each column of the memory array;
detecting a reading of the contents of the first reference cell in a zone of the additional column which is spaced substantially by a height of a column of the memory array from a site of generation of the additional selection signal, the detecting comprising comparing a voltage difference at terminals of the additional column with a first reference voltage corresponding, with regard to a ratio between the column capacitance of a column of the memory array and the column capacitance of the additional column, to a second reference voltage greater than an offset voltage of an amplifier of the read circuit; and
activating the read circuit only if the detection occurs so as to allow the reading of the contents of the selected memory cell or cells of the memory array.

7. A process according to claim 6, wherein the column capacitance of the additional column is substantially equal to a sub-multiple of the column capacitance of a column of the memory array.

8. A process according to claim 6, further comprising the step of using the additional selection signal to select a second reference memory cell structurally analogous to the memory cells of the memory array and having predetermined contents, the second reference cell being placed at the intersection of the additional row and of a second additional column of column memory cells which is arranged in the exterior vicinity of the first additional column and is configured to exhibit a column capacitance equal to that of each column of the memory array.

9. A process according to claim 8, further comprising the step of detecting a reading of the contents of the second reference cell in a zone of the second additional column spaced substantially by the height of a column of the memory array from the site of generation of the additional selection signal.

10. A process according to claim 9, further comprising the step of deactivating the read circuit only if the detecting of a reading of the contents of the second reference cell occurs so as to halt the reading of the contents of the selected memory cell or cells of the memory array.

11. A memory device comprising:
an array of memory cells defining a memory array;
row selection means for delivering a row selection signal to select a row of memory cells of the memory array;
column selection means for selecting at least one column of memory cells;
a read circuit connected to the column selection means;
control means for controlling the row selection means, the column selection means, and the read circuit;
additional row selection means for delivering an additional row selection signal;
an additional row of memory cells, arranged in an exterior vicinity of the memory array, and having a first end connected to an output of the additional row selection means, and being configured to exhibit signal propagation conditions analogous to each row of the memory array;
a first additional column of memory cells arranged in an exterior vicinity of the memory array and configured to exhibit a column capacitance of predetermined value with respect to a value of column capacitance of each column of the memory array;
a first reference memory cell structurally analogous to the memory cells of the memory array and having predetermined contents, the first memory cell being placed at an intersection of the additional row of memory cells and the first additional column of memory cells; and
first additional column selection means for selecting the first additional column;
said control means further comprising
first detection means arranged in a zone of the first additional column and spaced substantially by a height of a column from the output of the additional row selection means to deliver a first detection signal indicative of reading of contents of the first reference cell, and means for simultaneously activating the row selection means and the additional row selection means, as well as simultaneously activating the column selection means and the first additional column selection means, and then activating the read circuit when the first detection signal occurs to allow reading of the contents of the selected memory cell or cells of the memory array.

12. A memory device according to claim 11, further comprising a first column metallization linking cells of the first additional column; wherein each column memory cell is linked to an end of a row of the memory array; and wherein said first column metallization is interrupted to subdivide the column memory cells of the first additional column into a first group of column memory cells which are connected to the first reference memory cell and to the first detection means and into a second group of column memory cells which are not connected to the first reference memory cell and to the first detection means.

13. A memory device according to claim 12, wherein a number of column memory cells of the first group is predetermined so that a column capacitance seen by the first detection means is substantially equal to a chosen sub-multiple of the column capacitance of a column of the memory array.

14. A memory device according to claim 11, wherein said first detection means comprise an inverter.

15. A memory device according to claim 12, wherein the additional row of line memory cells is arranged between a last row of the memory array and the column selection means; and wherein said row selection means is arranged between the additional row selection means and the additional row of memory cells.

16. A memory device according to claim 12, wherein the first group of column memory cells of the additional column is arranged between the first reference memory cell and the second group of column memory cells of the first additional column.

17. A memory device according to claim 12, wherein the first reference memory cell is structurally analogous to each memory cell of the memory array and furthermore comprises a specific internal connection for holding a value of the stored bit; wherein each memory cell of the additional row of memory cells is structurally analogous to each memory cell of the memory array but is functionally inactive with regard to the memory cells of that column of the memory array at the end of which it is arranged; and wherein each column memory cell of the first additional column connected to the first detection means is structurally analogous to each memory cell of the memory array but is functionally inactive with regard to the first reference memory cell.

18. A memory device according to claim 12, wherein at least some of the memory cells of the second group of the first additional column are structurally identical to the memory cells of the additional row of memory cells.

19. A memory device according to claim 12, further comprising:
   a second additional column of memory cells arranged in the exterior vicinity of the first additional column and being configured to exhibit a column capacitance equal to that of each column of the memory array;
   a second reference memory cell structurally analogous to the memory cells of the memory array and having predetermined contents, said second reference memory cell being at the intersection of the additional row of memory cells and of the second additional column of memory cells;
   each column memory cell of the second additional column being structurally analogous to each memory cell of the memory array but functionally inactive with regard to the second reference memory cell;
   second additional means of column selection for selecting the second additional column;
   said control means further comprising
      second detection means arranged in a zone of the second additional column spaced substantially by the height of a column from an output of the additional row selection means to deliver a second detection signal indicative of the reading of the contents of the second reference cell, and
      means for simultaneously activating the row selection means and the additional row selection means, as well as simultaneously activating the column selection means and the first and second additional column selection means, and then deactivating the read circuit when the second detection signal occurs to halt reading of the contents of the selected memory cell or cells of the memory array.

20. A memory device comprising:
   an array of memory cells defining a memory array;
   a line selection circuit for delivering a row selection signal to select a row of memory cells of the memory array;
   a column selection circuit for selecting at least one column of memory cells;
   a read circuit connected to the column selection circuit;
   a control circuit for controlling the row selection circuit, the column selection circuit, and the read circuit;
   an additional row selection circuit for delivering an additional row selection signal;
   an additional row of memory cells, arranged in an exterior vicinity of the memory array, and having a first end connected to an output of the additional row selection circuit, and being configured to exhibit signal propagation conditions analogous to each row of the memory array;
   a first additional column of memory cells arranged in an exterior vicinity of the memory array and configured to exhibit a column capacitance of predetermined value with respect to a value of column capacitance of each column of the memory array;
   a first reference memory cell structurally analogous to the memory cells of the memory array and having predetermined contents, the first memory cell being placed at an intersection of the additional row of memory cells and the first additional column of memory cells; and
   a first additional column selection circuit for selecting the first additional column;
      said control circuit further comprising
         a first detection circuit arranged in a zone of the first additional column and spaced substantially by a height of a column from the output of the additional row selection circuit to deliver a first detection signal indicative of reading of contents of the first reference cell, and
         a circuit for simultaneously activating the row selection circuit and the additional row selection circuit, as well as simultaneously activating the column selection circuit and the first additional column selection circuit, and then activating the read circuit when the first detection signal occurs to allow reading of the contents of the selected memory cell or cells of the memory array; and
         a first column metallization linking cells of the first additional column with each column memory cell linked to an end of a row of the memory array, said first column metallization being interrupted to subdivide the column memory cells of the first additional column into a first group of column memory cells which are connected to the first reference memory cell and to the first detection circuit and into a second group of column memory cells which are not connected to the first reference memory cell and to the first detection circuit.

21. A memory device according to claim 20, wherein a number of column memory cells of the first group is predetermined so that a column capacitance seen by the first detection circuit is substantially equal to a chosen submultiple of the column capacitance of a column of the memory array.

22. A memory device according to claim 20, wherein said first detection circuit comprises an inverter.

23. A memory device according to claim 20, wherein the additional row of row memory cells is arranged between a last row of the memory array and the column selection circuit; and wherein said row selection circuit is arranged between the additional row selection circuit and the additional row of memory cells.

24. A memory device according to claim 20, wherein the first group of column memory cells of the additional column is arranged between the first reference memory cell and the second group of column memory cells of the first additional column.

25. A memory device according to claim 20, wherein the first reference memory cell is structurally analogous to each memory cell of the memory array and furthermore comprises a specific internal connection for holding a value of the stored bit; wherein each memory cell of the additional row of memory cells is structurally analogous to each memory cell of the memory array but is functionally inactive with regard to the memory cells of that column of the memory array at the end of which it is arranged; and wherein each column memory cell of the first additional column connected to the first detection circuit is structurally analogous to each memory cell of the memory array but is functionally inactive with regard to the first reference memory cell.

26. A memory device according to claim 20, wherein at least some of the memory cells of the second group of the first additional column are structurally identical to the memory cells of the additional row of memory cells.

27. A memory device according to claim 20, further comprising:
   a second additional column of memory cells arranged in the exterior vicinity of the first additional column and being configured to exhibit a column capacitance equal to that of each column of the memory array;
   a second reference memory cell structurally analogous to the memory cells of the memory array and having predetermined contents, said second reference memory cell being at the intersection of the additional row of memory cells and of the second additional column of memory cells;
   each column memory cell of the second additional column being structurally analogous to each memory cell of the memory array but functionally inactive with regard to the second reference memory cell; and
   a second additional column selection circuit for selecting the second additional column;
   said control circuit further comprising
      a second detection circuit arranged in a zone of the second additional column spaced substantially by the height of a column from an output of the additional row selection circuit to deliver a second detection signal indicative of the reading of the contents of the second reference cell, and
      a circuit for simultaneously activating the line selection circuit and the additional line selection circuit, as well as simultaneously activating the column selection circuit and the first and second additional column selection circuits, and then deactivating the read circuit when the second detection signal occurs to halt reading of the contents of the selected memory cell or cells of the memory array.

* * * * *